(12) United States Patent
Banno et al.

(10) Patent No.: US 11,952,520 B2
(45) Date of Patent: Apr. 9, 2024

(54) METHOD FOR MANUFACTURING PHOSPHOR POWDER, PHOSPHOR POWDER, AND LIGHT EMITTING DEVICE

(71) Applicant: DENKA COMPANY LIMITED, Tokyo (JP)

(72) Inventors: Hiroki Banno, Tokyo (JP); Hiroaki Toyoshima, Tokyo (JP)

(73) Assignee: DENKA COMPANY LIMITED, Tokyo (JP)

(*) Notice: Subject to any disclaimer, the term of this patent is extended or adjusted under 35 U.S.C. 154(b) by 0 days.

(21) Appl. No.: 18/022,278

(22) PCT Filed: Aug. 10, 2021

(86) PCT No.: PCT/JP2021/029494
§ 371 (c)(1),
(2) Date: Feb. 21, 2023

(87) PCT Pub. No.: WO2022/044792
PCT Pub. Date: Mar. 3, 2022

(65) Prior Publication Data
US 2023/0323199 A1 Oct. 12, 2023

(30) Foreign Application Priority Data
Aug. 25, 2020 (JP) .................. 2020-141748

(51) Int. Cl.
*C09K 11/59* (2006.01)
*C09K 11/08* (2006.01)
*C09K 11/55* (2006.01)

(52) U.S. Cl.
CPC ........ *C09K 11/592* (2013.01); *C09K 11/0822* (2013.01); *C09K 11/0883* (2013.01); *C09K 11/55* (2013.01)

(58) Field of Classification Search
CPC .............. C09K 11/592; C09K 11/0822; C09K 11/0883; C09K 11/55
See application file for complete search history.

(56) References Cited

U.S. PATENT DOCUMENTS

| 10,738,238 B2 | 8/2020 | Fiedler et al. |
| 11,021,652 B2 | 6/2021 | Fiedler et al. |

(Continued)

FOREIGN PATENT DOCUMENTS

| JP | 2008-230873 A | 10/2008 |
| JP | 2018-512481 A | 5/2018 |

(Continued)

OTHER PUBLICATIONS

Oct. 19, 2021 International Search Report issued in International Patent Application No. PCT/JP2021/029494.

(Continued)

*Primary Examiner* — Mary Ellen Bowman
(74) *Attorney, Agent, or Firm* — Oliff PLC

(57) ABSTRACT

A method for manufacturing a phosphor powder of the present invention, in which the phosphor powder contains an inorganic compound in which Eu as an activator is solid-soluted in a crystal represented by $Ba_{26}Si_{51}O_2N_{84}$ or in an inorganic crystal having the same crystal structure as the crystal represented by $Ba_{26}Si_{51}O_2N_{84}$, the method including: a mixing step of mixing a raw material containing each element constituting the inorganic compound to obtain a raw material mixture blended such that $b=51$ and $a/b>(26-c)/51$ are satisfied when molar ratios of Ba, Si, and Eu in the raw material mixture are respectively a, b, and c; a firing step of firing the raw material mixture to obtain a fired product; and a cleaning treatment step of subjecting the fired product to an acid treatment and/or a water treatment.

10 Claims, 2 Drawing Sheets

(56) References Cited

U.S. PATENT DOCUMENTS

| | | |
|---|---|---|
| 2013/0215597 A1 | 8/2013 | Davis |
| 2018/0044585 A1 | 2/2018 | Fiedler et al. |
| 2020/0332182 A1 | 10/2020 | Fiedler et al. |
| 2021/0079298 A1 | 3/2021 | Takeda et al. |
| 2022/0243126 A1 | 8/2022 | Hirosaki et al. |

FOREIGN PATENT DOCUMENTS

| | | |
|---|---|---|
| JP | 6572373 B1 | 9/2019 |
| JP | 2020-059764 A | 4/2020 |
| JP | 6684412 B1 | 4/2020 |
| JP | 2020-83945 A | 6/2020 |
| WO | 2012/046288 A1 | 4/2012 |

OTHER PUBLICATIONS

Oct. 19, 2021 International Search Report issued in International Patent Application No. PCT/JP2021/029502.
U.S. Appl. No. 18/022,279, filed Feb. 21, 2023 in the name of Hiroki Banno.
Nov. 16, 2023 Office Action issued in U.S. Appl. No. 18/022,279.
Sep. 12, 2023, Office Action issued in Chinese Application No. 202180051450.1.

ized. Patent Document 1 discloses that Eu is activated in $Ba_{26}Si_{51}O_2N_{84}$ to emit near infrared light (paragraph 0001, Example 1 paragraphs 0090 to 0092, and the like of Patent Document 1).

RELATED DOCUMENT

Patent Document

[Patent Document 1] Japanese Patent No. 6684412

SUMMARY OF THE INVENTION

Technical Problem

However, as a result of examination by the inventors of the present invention, it became clear that in a phosphor powder disclosed in Patent Document 1 containing an inorganic compound in which Eu is activated in a crystal represented by $Ba_{26}Si_{51}O_2N_{84}$, because a large amount of secondary phases emitting orange light is by-produced, which deteriorates optical characteristics, there is room for improvement in terms of reduction of secondary phases and luminescence characteristics in order to use the phosphor powder practically.

Solution to Problem

The following findings were obtained by the further examination by the inventors of the present invention.

First, when phosphor particles contained in a phosphor powder were analyzed, it became clear that a secondary phase emitting orange light contained in the above-mentioned phosphor powder was a phosphor in which Eu was activated in $Ba_2Si_5N_8$. It was found that this secondary phase emitting orange light can be reduced by firing after designing a composition in which Ba is excessive in the stoichiometric ratio.

However, when the above-mentioned approach for reducing the secondary phase emitting orange light was adopted, a secondary phase emitting red light was newly generated. As a result of analysis, it became clear that the secondary phase emitting red light was a phosphor in which Eu was activated in $Ba_3Si_3O_3N_4$. It was found that this secondary phase emitting red light can be reduced by cleaning using an acid or the like.

In this manner, the inventors of the present invention found that a secondary phase emitting orange light and a secondary phase emitting red light can be reduced by firing a raw material mixture in which the composition was designed such that. Ba was excessive, and cleaning the obtained fired product by an acid treatment and/or a water treatment, and thereby the present invention was completed.

According to the present invention, the following method is provided.

A method for manufacturing a phosphor powder which contains an inorganic compound in which. Eu as an activator is solid-saluted in a crystal represented by $Ba_{26}Si_{51}O_2N_{84}$ or in an inorganic crystal having the same crystal structure as the crystal represented by $Ba_{26}Si_{51}O_2N_{84}$, the method including:

a mixing step of mixing a raw material containing each element constituting the above-mentioned inorganic compound to obtain a raw material mixture blended such that b=51 and a/b>(26−c)/51 are satisfied when molar ratios of Ba, Si, and Eu in the raw material mixture are respectively a, b, and c;

a firing step of firing the above-mentioned raw material mixture to obtain a fired product; and a cleaning treatment step of subjecting the above-mentioned fired product to an acid treatment and/or a water treatment.

According to the present invention, the following phosphor powder is further provided.

A phosphor powder containing an inorganic compound in which Eu as an activator is solid-saluted in a crystal represented by $Ba_{26}Si_{51}O_2N_{84}$ or in an inorganic crystal having the same crystal structure as the crystal represented by $Ba_{26}Si_{51}O_2N_{84}$, in which in an emission spectrum obtained by irradiating the phosphor powder with excitation light having a wavelength of 450 nm, when a luminescence intensity at a peak wavelength in a range of equal to or more than 700 nm and equal to or less than 1500 nm is P0, and when a luminescence intensity at a peak wavelength of equal to or more than 500 nm and less than 700 nm is P1, $P1/P0 \leq 0.20$ is satisfied by P0 and P1.

According to the present invention, the following light emitting device is still further provided.

A light emitting device including: a light emitting element that emits primary light; and a wavelength conversion body that absorbs a part of the above-mentioned primary light to emit secondary light having a wavelength longer than a wavelength of the primary light, in which the above-mentioned wavelength conversion body contains the above-mentioned phosphor powder.

Advantageous Effects of Invention

According to the present invention, a method for manufacturing a phosphor powder by which secondary phases can be reduced, a phosphor powder having excellent luminescence characteristics, and a light emitting device having excellent luminescence characteristics are provided.

DESCRIPTION OF EMBODIMENTS

Figure 1:
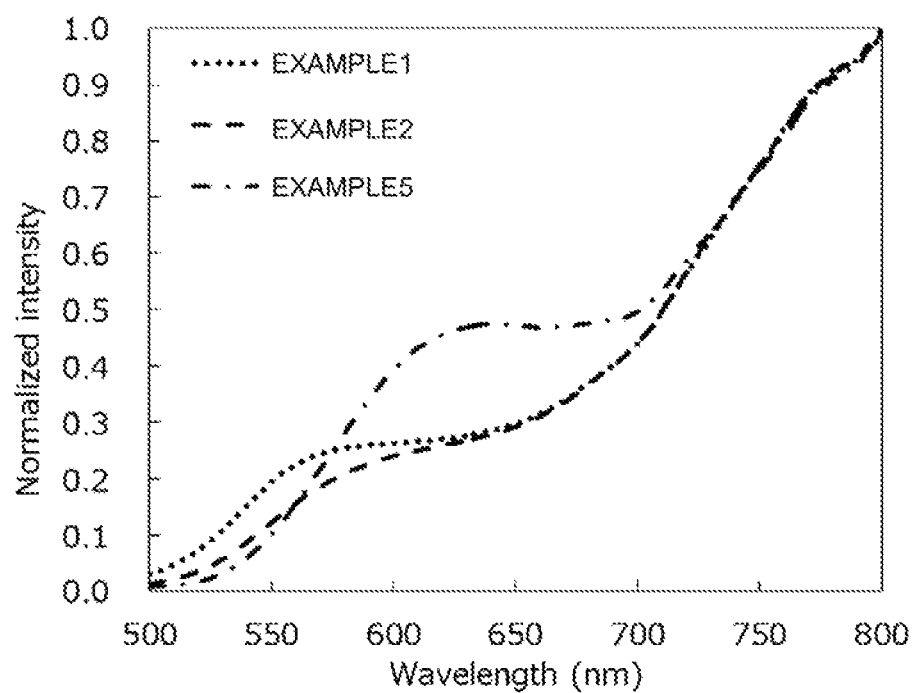
FIG. 1 is a graph showing the emission spectra of fired products before an acid treatment of Examples 1, 2, and 5.

A method for manufacturing a phosphor powder of the present embodiment will be outlined.

The method for manufacturing a phoshor powder of the present embodiment is a method for manufacturing a phosphor powder containing an inorganic compound in which Eu as an activator is solid-soluted in a crystal represented by $Ba_{26}Si_{51}O_2N_{84}$ or in an inorganic crystal having the same crystal structure as the crystal represented by $Ba_{26}Si_{51}O_2N_{84}$.

The method for manufacturing a phosphor powder includes: a mixing step of mixing a raw material containing each element constituting the inorganic compound to obtain a raw material mixture blended such that b=51 and a/b>(26−c)/51 are satisfied when molar ratios of Ba, Si, and Eu are respectively a, b, and c; a firing step of firing the raw material mixture to obtain a fired product; and a cleaning treatment step of subjecting the fired product to an acid treatment and/or a water treatment.

According to the inventors of the present invention, the following findings were found.

It became clear that a large amount of secondary phases emitting orange light other than the target crystal represented by $Ba_{26}Si_{51}O_2N_{84}$ was by-produced when a $(Ba, Eu)_{26}Si_{51}O_2N_{84}$ composition was designed as a raw material composition, the raw material was mixed to fire a raw material mixture, and thereby a phosphor powder was synthesized. As a result of analysis, it was found that this secondary phase emitting orange light was a phosphor in which Eu is activated in $Ba_2Si_5N_8$.

As a result of examination, it was thought that the reason why the phosphor in which Eu was activated in $Ba_2Si_5N_8$ was by-produced was that the Ba element was insufficient due to vaporization of the raw material. A raw material containing a Ba element such as $Ba_2N$ may vaporize depending on the firing conditions and dissipate from a reaction container to the outside. The reduction of the Ba element from the raw material results in the synthesis condition in which $Ba_2Si_5N_8$, which is a compound having a small amount of Ba than $Ba_{26}Si_{51}O_2N_{84}$ is likely to be generated.

Therefore, it became clear that the generation of secondary phases emitting orange light can be suppressed by designing the composition in which Ba is excessive to compensate for the deficiency due to vaporization, and then firing.

On the other hand, when a raw material containing a Ba element such as $Ba_3N_2$ was excessively charged to fire a raw material mixture designed to have the composition in which Ba is excessive, it was confirmed that a secondary phase emitting red light was newly generated although a secondary phase emitting orange light were not confirmed.

As a result of analysis, it was found that this secondary phase emitting red light was a phosphor in which Eu was activated in $Ba_3Si_3O_3N_4$.

However, because the Ba/Si composition ratios of the three compounds, which were a secondary phase $Ba_2Si_5N_8$, $Ba_{26}Si_{51}O_2N_{84}$, and a secondary phase $Ba_3Si_3O_3N_4$, were respectively 0.4, 0.51, and 1.0, it was difficult to reduce both of the two secondary phases by controlling the composition design.

Therefore, as a result of examining a method for reducing the secondary phase $Ba_3Si_3O_3N_4$ by a method other than the composition design control, it became clear that $Ba_3Si_3O_3N_4$ can be reduced by performing a cleaning treatment using an acid such as nitric acid or water. $Ba_{26}Si_{51}O_2N_{84}$ has the characteristic of being almost insoluble in nitric acid.

As described above, it was found that secondary phases emitting orange light and secondary phases emitting red light can be reduced by performing firing in the state in which Ba was charged in an amount exceeding the stoichiometric composition represented by $(Ba, Eu)_{26}Si_{51}O_2N_{84}$, and performing an acid treatment and/or a water treatment.

The manufacturing method of the present embodiment enables to embody the phosphor powder having reduced secondary phases and excellent luminescence characteristics.

The present embodiment enables to embody the phosphor powder that can be excited by from ultraviolet light of about 300 nm to 650 nm to visible light, and can emit light having a peak in the near infrared range of 700 nm to 1500 nm.

A wavelength conversion body containing the phosphor powder of the present embodiment is configured of a member that converts radiated light (excitation light) and emits light having the light emission peak in the wavelength range different from that of the excitation light. The wavelength conversion body may configure at least a part of a light emitting device described below. The wavelength conversion body may emit light having the light emission peak in the wavelength range of equal to or more than 700 nm and equal to or less than 1500 nm, for example. The wavelength conversion body may contain one or two or more phosphors other than the phosphor powder of the present embodiment.

The wavelength conversion body may be configured only of the phosphor powder, or may contain a base material in which the phosphor powder has been dispersed. As the base material, known materials can be used, and examples thereof include glass, resins, and inorganic materials. The shape of the wavelength conversion body is not particularly limited, but the wavelength conversion body may be configured in a plate shape, and may be configured to seal a part of a light emitting element or the entire light emitting surface, for example.

The light emitting device as an example containing the phosphor powder of the present embodiment includes the light emitting element that emits primary light, and the wavelength conversion body that absorbs a part of the primary light to emit the secondary light having the wavelength longer than the wavelength of the primary light.

The light emitting device can be used for various usage applications such as sensors, inspection, and analysis use, security use, optical communication use, medical use, and foods, and examples thereof include LED packages, light sources, spectrophotometers, food analyzers, wearable devices, medical and healthcare devices, infrared cameras, moisture measurement devices, and gas detectors.

The method for manufacturing the phosphor powder of the present embodiment will be described in detail below.

An example of the method for manufacturing phosphor includes the mixing step of obtaining the raw material mixture containing each element constituting the inorganic compound in which Eu as an activator is solid-soluted in the crystal represented by $Ba_{26}Si_{51}O_2N_{84}$ or in the inorganic crystal having the same crystal structure as the crystal represented by $Ba_{26}Si_{51}O_2N_{84}$ the firing step of firing the raw material mixture to obtain the fired product; and the cleaning treatment step of subjecting the fired product to an acid treatment and/or a water treatment.

Examples of the raw material containing a Ba element include a single substance, a mixture of two or more types, or the like containing Ba and selected from metals, silicides, oxides, carbonates, nitrides, oxynitrides, chlorides, fluorides, and oxyfluorides.

Examples of the raw material containing a Si element include a single substance, a mixture of two or more types, or the like containing Si and selected from metals, silicides, oxides, carbonates, nitrides, oxynitrides, chlorides, fluorides, and oxyfluorides.

As the raw material containing an Eu element, a single substance, a mixture of two or more types, or the like containing Eu and selected from metals, silicides, oxides, carbonates, nitrides, oxynitrides, chlorides, fluorides, and oxyfluorides is used.

As the raw material mixture, one that contains a Ba nitride, a Si nitride and/or oxide, or an Eu nitride and/or oxide, for example, may be used. Accordingly, the reaction at the time of firing can be promoted.

In the mixing step, an excessive amount of Ba is blended into the raw material mixture such that b=51 and a/b>(26−c)/51 are satisfied when molar ratios of Ba, Si, and Eu in the starting composition in the raw material mixture are respectively a, b, and c. By firing the raw material mixture having such a starting composition, secondary phases such as $(Ba, Eu)_2Si_5N_8$ can be reduced.

Furthermore, it is preferable that 0.51<a/b<1 be satisfied by a, b, and c which are described above. Specifically, the lower limit of a/b may be more than 0.51, may be equal to or more than 0.55, or may be equal to or more than 0.60, for example. By firing the raw material mixture having such a starting composition, secondary phases of $(Ba, Eu)_2Si_5N_8$ can be reduced.

On the other hand, the upper limit of a/b may be less than 1.0, may be equal to or less than 0.8, or may be equal to or less than 0.7, for example. By firing the raw material mixture having such a starting composition, secondary phases of $(Ba, Eu)_3Si_3O_3N_4$ can be reduced.

In addition, the molar ratio of Ba in the starting composition is more than 1.0 times, preferably equal to or more than 1.5 times, more preferably equal to or more than 1.8 times, and further preferably equal to or more than 2.0 times the stoichiometric ratio in the composition represented by General Formula: $(Ba_{t-x}, Eu_x)_{26}Si_{51}O_2N_{84}$. By firing the raw material mixture having such a starting composition, secondary phases of $(Ba, Eu)_2Si_5N_8$ can be reduced.

In the above-mentioned general formula, x, that is, the molar ratio of Eu, is not particularly limited, but may be equal to or more than 0.0001, may be equal to or more than 0.0005, or may be equal to or more than 0.001, and may be equal to or less than. 0.5, may be equal to or less than 0.3, or may be equal to or less than 0.2. In the appropriate range, the absorptance, the internal quantum efficiency, and the external quantum efficiency can be improved.

A method of mixing the raw materials is not particularly limited, but examples thereof include a method of sufficiently mixing using a mixing device such as a mortar, a ball mill, a V-type mixer, a planetary mill, or the like.

Subsequently, the obtained raw material mixture is fired (firing step). Thereby, a reaction product (fired product) after the firing step is obtained.

In the firing step, a firing furnace such as an electric furnace may be used, for example. As an example, the raw material mixture with which the inside of a firing container is filled may be fired.

The firing container is preferably made of a material that is stable under a high temperature atmosphere gas and that is less likely to react with the raw material mixture and the reaction product thereof, and for example, it is preferable to use a container made of boron nitride or carbon, or a container made of a high-melting-point metal such as molybdenum, tantalum, and tungsten.

As the type of firing atmosphere gas in the firing step, for example, a gas containing nitrogen as an element can be preferably used. Specific examples thereof include nitrogen and/or ammonia, where nitrogen is particularly preferable. Similarly, inert gases such as argon and helium can also be preferably used. Among these, nitrogen gas is preferable. The firing atmosphere gas may be composed of one type of gas, or may be a mixed gas of a plurality of types of gas.

The inside of the firing container may be filled with the above-mentioned firing atmosphere gas.

The firing temperature in the firing step is selected in an appropriate temperature range from the viewpoint of reducing unreacted raw materials after the completion of the firing step and preventing decomposition of the main component.

The lower limit of the firing temperature in the firing step is preferably equal to or higher than 1500° C., more preferably equal to or higher than 1600° C., and further preferably equal to or higher than 1700° C. On the other hand, the upper limit of the firing temperature is preferably equal to or lower than 2200° C., more preferably equal to or lower than 2000° C., and further preferably equal to or lower than 1900° C.

The pressure of the firing atmosphere gas is selected according to the firing temperature, but a pressurization state in the range of 0.1 MPa or more and 10 MPa or less is usually used. When considering industrial productivity, the pressure is preferably equal to or more than 0.5 MPa and equal to or less than 1 MPa.

The firing time in the firing step is selected in an appropriate time range from the viewpoint of reducing unreacted products and improving productivity.

The lower limit of the firing time is preferably equal to or longer than 0.5 hours, and more preferably equal to or longer than 1 hour. In addition, the upper limit of the firing time is preferably equal to or shorter than 48 hours, more preferably equal to or shorter than 24 hours, and further preferably equal to or shorter than 16 hours.

Subsequently, the reaction product (fired product) after the firing step may be subjected to a powder treatment in which at least one of pulverization, crushing, and/or sieving is performed (powder treatment step).

The state of the fired product obtained by the firing step varies from powdery to bulky depending on the blending of raw materials and the firing conditions. By the crushing and pulverization step and/or a classification operation step, the fired product can be made into a powder of a predetermined size.

In addition to the above-mentioned steps, a step known in the field of phosphors may be added.

Subsequently, the fired product is subjected to an acid treatment and/or a water treatment (cleaning treatment step).

The cleaning treatment step includes a step of bringing the fired product into contact with at least one of an acid, an acidic solution containing an acid, water, and/or a neutral aqueous solution. The acid treatment is preferably performed using an acidic solution.

This makes it possible to reduce secondary phases of $(Ba, Eu)_3Si_3O_3N_4$ while leaving the main phase of $(Ba, Eu)_{26}Si_{51}O_2N_{84}$. In addition, secondary phases of $(Ba, Eu)SiN_2$, can also be reduced.

The term "neutral" means that the pH is 7 when a measurement target at the liquid temperature of 23° C.±0.5° C. is measured using a pH meter.

In the acid treatment and/or water treatment, the fired product may be added to the acid solution and/or water, or the acid and/or water may be added to the fired product in the solution. The acid solution and/or water may be left to stand during the treatment, but may be stirred under appropriate conditions.

In addition, after the acid treatment, decantation (solid-liquid separation treatment) may be performed using water or alcohol, as necessary. The decantation may be performed one time or two or more times. Thereby, the acid can be removed from the fired Product. Thereafter, the fired product may be filtered, dried, or the like.

For the acid, for example, an inorganic acid may be used, and specific examples thereof include $HNO_3$, $HCl$, $H_2SO_4$, and $H_3PO_4$. These may be used alone or may be used in combination of two or more types. Among the inorganic acids, at least one of $HNO_3$ and $HCl$ is preferably contained, and $HNO_3$ is preferably contained.

The acid solution may contain water or alcohol as a solvent.

The acid concentration in the acid solution may be 0.1% by mass to 20% by mass, and is preferably 0.5% by mass to 10% by mass, for example.

As described above, the phosphor particles of the present embodiment are obtained.

Thereafter, for example, a post treatment such as a crushing and classification treatment, a purification treatment, and a drying treatment may be performed as necessary.

The phosphor powder of the present embodiment will be described in detail.

The phosphor powder of the present embodiment contains the inorganic compound in which Eu as an activator is solid-soluted in the crystal represented by $Ba_{26}Si_{51}O_2N_{84}$ inorganic crystal having the same crystal structure as the crystal represented by $Ba_{26}Si_{51}O_2N_{84}$.

The phosphor powder has a peak wavelength in the range of equal to or more than 700 nm and equal to or less than 1500 nm in the emission spectrum obtained by irradiating the phosphor powder with excitation light having the wavelength of 450 nm.

The half-width of the emission spectrum having a peak wavelength in the range of equal to or more than 700 nm and equal to or less than 1500 nm is equal to or more than 100 nm and equal to or less than 400 nm, preferably equal to or more than 150 nm and equal to or less than 350 nm, and more preferably equal to or more than 200 nm and equal to or less than 300 nm, for example. This makes it possible to increase the luminescence intensity.

In the emission spectrum obtained by irradiating the phosphor powder with excitation light having the wavelength of 450 nm, a luminescence intensity at a peak wavelength in the range of equal to or more than 700 nm and equal to or less than 1500 nm is P0, and a maximum luminescence intensity at a peak wavelength of equal to or more than 500 nm and less than 700 nm is P1.

The range of equal to or more than 700 nm and equal to or less than 1500 nm includes a main peak attributed to (Ba, Eu)$_{26}Si_{51}O_2N_{84}$. The range of equal to or more than 500 nm and less than 700 nm includes peaks attributed to secondary phases such as (Ba, Eu)$_3Si_3O_3N_4$ and (Ba, Eu)$SiN_2$.

The upper limit of P1/P0 calculated from P0 and P1 is equal to or less than 0.20, preferably equal to or less than 0.15, and more preferably equal to or less than 0.12. This enables to embody the phosphor powder in which secondary phases such as (Ba, Eu)$_3Si_3O_3N_4$, (Ba, Eu)$SiN_2$, and (Ba, Eu)$_2Si_5N_8$ are reduced. In addition, the phosphor powder that can be used practically by enhancing the luminescence characteristics can be provided.

On the other hand, the lower limit of P1/P0 is preferably 0, but it may be, for example, equal to or more than 0.001 because it is acceptable to include an unavoidable secondary phase within a practically acceptable range.

In the present embodiment, the above-mentioned P1/P0 can be controlled by appropriately selecting a preparation method of the phosphor powder, for example. Among these, examples of factors for setting the above-mentioned P1/P0 within a desired numerical value range include firing the blended raw material mixture, and performing the acid treatment on the fired product.

Regarding the phosphor powder, in a volume frequency particle size distribution measured using a laser diffraction scattering method, the particle size at which the cumulative value is 50% is defined as D50, the particle size at which the cumulative value is 10% is defined as D10, and the particle size at which the cumulative value is 90% is defined as D90.

D50 is equal to or more than 1 μm and equal to or less than 50 μm, preferably equal to or more than 5 μm and equal to or less than 45 μm, and more preferably equal to or more than 10 μm and equal to or less than 40 μm, for example. In the above-mentioned range, a balance in luminescence characteristics can be achieved.

The lower limit of ((D90-D10)/D50) is equal to or more than 1.00, preferably equal to or more than 1.20, and more preferably equal to or more than 1.30, for example. On the other hand, the upper limit of ((D90-D10)/D50) is equal to or less than 3.00, preferably equal to or less than 2.50, and more preferably equal to or less than 2.00. In the above-mentioned range, a balance in luminescence characteristics can be achieved.

Although the embodiments of the present invention have been described above, these are examples of the present invention, and various configurations other than the above can be adopted. Furthermore, the present invention is not limited to the above-mentioned embodiments, and modifications, improvements, and the like within the scope capable of achieving the object of the present invention are included in the present invention.

EXAMPLES

Hereinafter, the present invention will be described in detail with reference to examples, but the present invention is not limited to the description of these examples.

(Manufacture of Phosphor Powder)

Examples 1 to 5 and Comparative Example 1

As shown in the starting composition in Table 1, a target composition was designed such that x was 0.002, 0.005, 0.008, 0.01, and 0.02 in the order of Examples 1 to 5, Ba was excessive by 1.2 times the stoichiometric ratio in Examples 1 to 5, and Ba was 1 time the stoichiometric ratio in Comparative Example 1 in General Formula: $(Ba_{1-x}, Eu_x)_{26}Si_{51}O_2N_{84}$, and barium nitride ($Ba_2N$, manufactured by TAIHEIYO CEMENT CORPORATION), europium oxide ($Eu_2O_3$, manufactured by Shin-Etsu Chemical Co., Ltd.), ($Si_3N_4$, manufactured by UBE INDUSTRIES, LTD.), and silicon oxide ($SiO_2$, manufactured by Kojundo Chemical Lab. Co., Ltd.) were weighed to perform mixing for 10 minutes in a glove box in a nitrogen atmosphere using a pestle and a mortar, which were formed of silicon nitride sintered bodies, thereby obtaining a powdery raw material mixture (mixing step).

In Table 1, the molar ratios of Ba, Si, and Eu in the raw material mixture are respectively represented by a, b, and c.

Subsequently, the raw material mixture was injected into a crucible formed of a boron nitride sintered body. The crucible containing the raw material mixture was put in a graphite resistance heating type electric furnace, the firing atmosphere was set to a vacuum equal to or less than 1×10⁻¹ Pa with an oil rotary pump and an oil diffusion pump, heating was performed from room temperature to 600° C. at the rate of 500° C. per hour, nitrogen with the purity of 99.999% by volume was introduced at 600° C. to set the pressure in the furnace to 0.8 MPa, and the temperature was raised to 1800° C. at 600° C. per hour to perform firing for 8 hours (firing step).

The obtained fired product was pulverized in an alumina mortar, and thereafter sieved with a sieve having the aperture of 150 μm (#100 mesh) to recover the powder that had passed through the sieve (powder treatment step).

The fired product in the form of the powder that had passed through the sieve was immersed in 300 ml of nitric acid ($HNO_3$ concentration: 7.5%), and stirred at room temperature for 30 minutes at the stirring speed of 350 rpm (cleaning treatment step by an acid).

Thereafter, removing the supernatant, washing with distilled water, suction filtration, and drying were performed to obtain a phosphor powder.

TABLE 1

| | starting composition | | | | | |
|---|---|---|---|---|---|---|
| | Chemical composition (molar ratio) | | | | | (26 − |
| Sample | Ba (a) | Eu (c) | Si (b) | O | a/b | c)/51 |
| Example 1 | 31.14 | 0.052 | 51 | 2 | 0.6106 | 0.5088 |
| Example 2 | 31.04 | 0.13 | 51 | 2 | 0.6086 | 0.5073 |
| Example 3 | 30.95 | 0.208 | 51 | 2 | 0.6069 | 0.5057 |
| Example 4 | 30.89 | 0.26 | 51 | 2 | 0.6057 | 0.5047 |
| Example 5 | 30.58 | 0.52 | 51 | 2 | 0.5996 | 0.4996 |
| Comparative Example 1 | 25.74 | 0.26 | 51 | 2 | 0.5047 | 0.5047 |

The obtained fired product and the obtained phosphor powder were evaluated for the following items.

[XRD Measurement]

Diffraction patterns of the fired products before and after the acid treatment of Examples 1 to 5 and Comparative Example 1 were measured using a powder X-ray diffractometer (product name: Ultima IV, manufactured by Rigaku Corporation) under the following measurement condition.

(Measurement Condition)
X-ray source: Cu-Kα ray (λ=1.54184 Å),
Output setting: 40 kV·40 mA
Optical conditions during measurement: divergence slit=⅔°
Scattering slit=8 mm
Light-receiving slit=open
Diffraction peak position=2θ (diffraction angle)
Measurement range: 2θ=10° to 90°
Scanning speed: 2 degrees (2θ)/sec, continuous scanning
Scan axis: 2θ/θ
Sample preparation: the phosphor powder was placed on a sample holder.

The value obtained by performing background correction was defined as the peak intensity.

From the results of the X-ray diffraction patterns, it was shown that in the fired products before the acid treatment of Examples 1 to 5, the main phase was $Ba_{26}Si_{51}O_2N_{84}$, and the by-produced secondary phases were one type or two or more types of $Ba_3Si_3O_3N_4$ and $BaSiN_2$. That is, it was found that the by-produced secondary phases did not include $Ba_2Si_5N_8$.

On the other hand, in the fired product before the acid treatment of Comparative Example 1, a peak attributed to $Ba_2Si_5N_8$ was observed.

Therefore, it became clear that the secondary phase $Ba_2Si_5N_8$ can be reduced by firing a raw material powder mixed at a specific blending ratio.

Furthermore, a peak attributed to $Ba_3Si_3O_3N_4$ was not observed from the X-ray diffraction patterns after the acid treatment of Examples 1 to 5, and it became clear that $Ba_3Si_3O_3N_4$ can be removed by the acid treatment.

[Fluorescence Measurement]

(Fluorescence Peak Intensity, Peak Wavelength, and Half-Width)

For the phosphor powders of the fired products before the acid treatment of Examples 1 to 5, the fluorescence peak intensity was measured using a fluorescence spectrophotometer (manufactured by Hitachi High-Tech Corporation, F-7000) which had been subjected to correction by YAG phosphor (P46Y3) and a secondary standard light source. For the measurement, a square cell holder attached to the spectrophotometer was used so as to be irradiated with excitation light having the wavelength of 450 nm, thereby obtaining an emission spectrum. FIG. 1 shows the emission spectra of the phosphor powders of the fired products before the acid treatment normalized by the luminescence intensity at the peak wavelength in Examples 1, 2, and 5.

In the emission spectra of the fired products before the acid treatment of Examples 1 to 5, it confirmed that a light emission peak attributed to the main phase (Ba, Eu)$_{26}$Si$_{51}$O$_2$N$_{84}$ was present at 700 nm to 1500 nm, and a light emission peak attributed to (Ba, Eu)$_3$Si$_3$O$_3$N$_4$, which was a secondary phase, was present in the range of 500 nm to 700 nm.

In addition, Comparative Example 1 showed a much higher value than Examples 1 to 5 in terms of the peak luminescence intensity at 500 nm to 700 nm.

Figure 2:
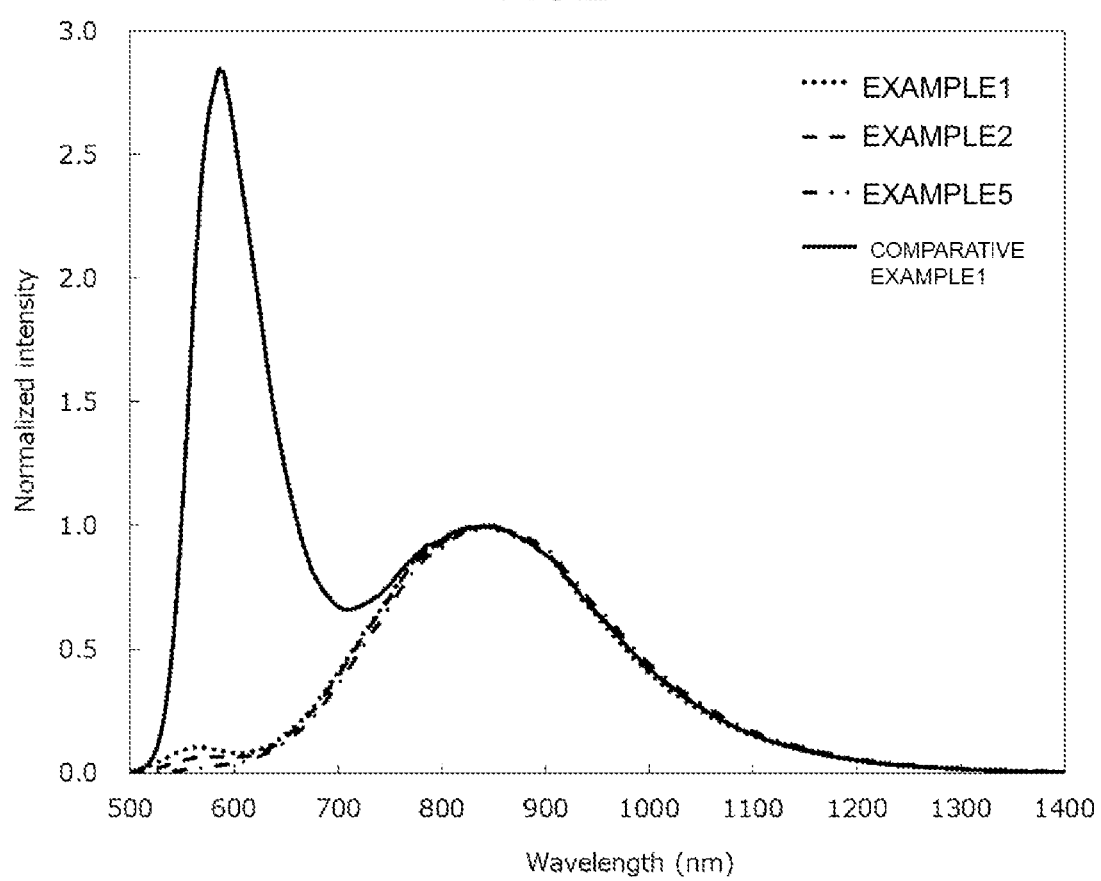
FIG. 2 is a graph showing the emission spectra of phosphor powders of Examples 1, 2, and 5 and Comparative Example 1.

For the phosphor powders of the fired products after the acid treatment of Examples 1 to 5, fluorescence peak intensities were measured using a fluorescence spectrophotometer (Fluorolog-3, manufactured by HORIBA, Ltd.) which had been subjected to correction by a secondary standard light source. For the measurement, a square cell holder attached to the spectrophotometer was used so as to be irradiated with excitation light having the wavelength of 450 nm, thereby obtaining an emission spectrum. FIG. 2 shows the emission spectra of the phosphor powders of the fired products after the acid treatment normalized by the luminescence intensity at the peak wavelength in Examples 1, 2, and 5 and Comparative Example 1.

In the emission spectra of the phosphor powders after the acid treatment of Examples 1 to 5, a peak attributed to (Ba, Eu)$_3$Si$_3$O$_3$N$_4$ and (Ba, Eu)SiN$_2$ in the range of 500 nm to 700 nm was not confirmed, whereas a main peak attributed to the main phase (Ba, Eu)$_{26}$Si$_{51}$O$_2$N$_{84}$ near 830 nm to 850 nm was confirmed to be present.

From the obtained emission spectra, for the peak wavelength in the range of equal to or more than 700 nm and equal to or less than 1500 nm, the peak position, the half-width, the luminescence intensity (P0), and the luminescence intensity (P1) at the peak wavelength of equal to or more than 500 nm and less than 700 were obtained and shown in Table 2.

The peak intensity at each wavelength was a relative value when the peak intensity in Example 3 was 1.00.

TABLE 2

| Sample | Peak wavelength (nm) of 700 nm to 1500 nm | Half-width (nm) of peak at 700 nm to 1500 nm | Luminescence intensity (P1) of peak at 500 nm to 700 nm | Luminescence intensity (P0) of peak at 700 nm to 1500 nm | P1/P0 |
| --- | --- | --- | --- | --- | --- |
| Example 1 | 837 | 263 | 0.10 | 0.90 | 0.11 |
| Example 2 | 835 | 263 | 0.06 | 0.95 | 0.07 |
| Example 3 | 840 | 264 | 0.04 | 1.00 | 0.04 |
| Example 4 | 835 | 264 | 0.04 | 0.88 | 0.04 |
| Example 5 | 850 | 264 | 0.02 | 0.87 | 0.02 |
| Comparative Example 1 | — | — | 1.99 | 0.70 | 2.85 |

(Peak Intensity)

As compared to Comparative Example 1, in the phosphor powders of Examples 1 to 5, the luminescence intensity of the peak at 500 nm to 700 nm due to secondary phase emission was reduced, and the luminescence intensity of light having a peak in the near infrared range of 700 nm to 1500 nm was increased.

[Particle Size Distribution Measurement]

The particle size distribution of the phosphor powders of Examples 1 to 5 was measured with a particle size distribution analyzer (manufactured by Beckman Coulter, Inc., LC13 320) of the laser diffraction and scattering method. Water was used as a measurement solvent. A small amount of the phosphor powder was injected to an aqueous solution to which 0.05% by weight of sodium hexametaphosphate had been added as a dispersant, and a dispersing treatment was performed with a horn-type ultrasound homogenizer (output 300 W, horn diameter 26 mm) to measure the particle size distribution. From the obtained volume frequency particle size distribution curve, the 10 vol % diameter (D10), 50 vol % diameter (D50), and 90 vol % diameter (D90) were determined, and thereby the span value of the particle size distribution ((D90-D10)/D50) was determined from the obtained value. Table 3 shows the particle size distribution results.

TABLE 3

| Sample | D10 (μm) | D50 (μm) | D90 (μm) | (D90 − D10)/D50 |
| --- | --- | --- | --- | --- |
| Example 1 | 15.1 | 34.2 | 64.6 | 1.45 |
| Example 2 | 13.2 | 32.3 | 61.9 | 1.51 |
| Example 3 | 16.6 | 37.9 | 71.9 | 1.46 |
| Example 4 | 12.0 | 31.6 | 60.9 | 1.55 |
| Example 5 | 15.5 | 36.2 | 70.8 | 1.53 |

It was found that the phosphor powders of Examples 1 to 5 had reduced secondary phases and had excellent luminescence characteristics, as compared to Comparative Example 1.

This application claims priority on the basis of Japanese Patent Application No. 2020-141748 filed on Aug. 25, 2020, and incorporates all of its disclosures herein.

The invention claimed is:

1. A method for manufacturing a phosphor powder which contains an inorganic compound in which Eu as an activator is solid-soluted in a crystal represented by $Ba_{26}Si_{51}O_2N_{84}$ or in an inorganic crystal having the same crystal structure as the crystal represented by $Ba_{26}Si_{51}O_2N_{84}$, the method comprising:
   a mixing step of mixing a raw material containing each element constituting the inorganic compound to obtain a raw material mixed powder blended such that b=51 and a/b>(26−c)/51 are satisfied when molar ratios of Ba, Si, and Eu in the raw material mixed powder are respectively a, b, and c;
   wherein the raw material mixed powder blended such that 0.60<a/b<1 is satisfied by a and b is obtained in the mixing step,
   a firing step of firing the raw material mixed powder to obtain a fired product; and
   a cleaning treatment step of subjecting the fired product to an acid treatment and/or a water treatment.

2. The method for manufacturing a phosphor powder according to claim 1,
   wherein an acid used in the acid treatment includes an inorganic acid.

3. The method for manufacturing a phosphor powder according to claim 2,
   wherein the acid includes $HNO_3$.

4. The method for manufacturing a phosphor powder according to claim 1, the method further comprising
   a powder treatment step of subjecting the fired product obtained in the firing step to at least one of pulverization, crushing, and/or sieving before the cleaning treatment step.

5. The method for manufacturing a phosphor powder according to claim 1,
   wherein in a volume frequency particle size distribution of the phosphor powder measured by a laser diffraction scattering method, when a particle size at which a cumulative value is 50% is D50, a phosphor powder in which D50 satisfies a value of equal to or more than 1 μm and equal to or less than 50 μm is obtained.

6. A phosphor powder comprising
   an inorganic compound in which Eu as an activator is solid-soluted in a crystal represented by $Ba_{26}Si_{51}O_2N_{84}$ or in an inorganic crystal having the same crystal structure as the crystal represented by $Ba_{26}Si_{51}O_2N_{84}$,
   wherein in an emission spectrum obtained by irradiating the phosphor powder with excitation light having a wavelength of 450 nm, when a luminescence intensity at a peak wavelength in a range of equal to or more than 700 nm and equal to or less than 1500 nm is P0, and when a luminescence intensity at a peak wavelength of equal to or more than 500 nm and less than 700 nm is P1, P1/P0≤0.20 and P0≥0.88 are satisfied by P0 and P1.

7. The phosphor powder according to claim 6,
   wherein in a volume frequency particle size distribution of the phosphor powder measured by a laser diffraction scattering method, when a particle size at which a cumulative value is 50% is D50, D50 is equal to or more than 1 μm and equal to or less than 50 μm.

8. The phosphor powder according to claim 6,
   wherein in a volume frequency particle size distribution of the phosphor powder measured by a laser diffraction scattering method, when a particle size at which a cumulative value is 10% is D10, a particle size at which a cumulative value is 50% is D50, and a particle size at which a cumulative value is 90% is D90, ((D90−D10)/D50) is equal to or more than 1.00 and equal to or less than 3.00.

9. The phosphor powder according to claim 6,
wherein in the emission spectrum, a half-width at the peak wavelength in the range of equal to or more than 700 nm and equal to or less than 1500 nm is equal to or more than 100 nm and equal to or less than 400 nm.

10. A light emitting device comprising:
a light emitting element that emits primary light; and
a wavelength conversion body that absorbs a part of the primary light to emit secondary light having a wavelength longer than a wavelength of the primary light,
wherein the wavelength conversion body contains the phosphor powder according to claim 6.

* * * * *